United States Patent [19]
Honda et al.

[11] Patent Number: 5,350,939
[45] Date of Patent: Sep. 27, 1994

[54] SEMICONDUCTOR DEVICE AND METHOD OF MANUFACTURING THEREOF

[75] Inventors: Hiroki Honda; Kimiharu Uga; Masahiro Ishida; Yoshiyuki Ishigaki, all of Hyogo, Japan

[73] Assignee: Mitsubishi Denki Kabushiki Kaisha, Tokyo, Japan

[21] Appl. No.: 37,141

[22] Filed: Mar. 25, 1993

[30]  Foreign Application Priority Data

Apr. 3, 1992 [JP] Japan .................................. 4-082483
Feb. 1, 1993 [JP] Japan .................................. 5-014890

[51] Int. Cl.⁵ ............................................. H01L 27/02
[52] U.S. Cl. ................................. 257/378; 257/548; 257/549; 257/550; 257/370; 257/371; 257/376
[58] Field of Search ............... 257/370, 371, 376, 378, 257/548, 549, 550

[56]  References Cited

U.S. PATENT DOCUMENTS 4,525,920  7/1985  Jacobs et al. ......................... 257/376
4,716,451  12/1987  Hsu et al. ............................. 257/376

FOREIGN PATENT DOCUMENTS 62-219554  9/1987  Japan .
2-3963  6/1988  Japan .
3-87059  4/1991  Japan .

OTHER PUBLICATIONS

Well and Buried Layer Structure Formed by Multiple Energy ion for Submicron C-BiCMOS High Speed BiCMOS VLSI Technology Buried Twin Well Structure Integration of a Double Polysilicon, Fully Self-Aligned Bipolar Transistor into a 0.5 um BiCMOS Technology for Fast 4MBit SRAMs.

*Primary Examiner*—Edward Wojciechowicz
*Attorney, Agent, or Firm*—Lowe, Price, LeBlanc & Becker

[57] ABSTRACT

An $n^-$ epitaxial layer 4 is formed on the top face of a p type semiconductor substrate 1. A $p^+$ buried layer 20 is formed by implanting ions in the region extending over the p type semiconductor substrate 1 and the $n^-$ epitaxial layer 4. A $p^+$ channel stop is formed in the upper layer of the $p^+$ buried layer 20 by ion implantation. A p well is formed extending from the upper layer of the $p^+$ channel stop to the top face of the $n^-$ epitaxial layer. An n channel MOS type field effect transistor 200 is formed in the p well 22. It is possible to reliably isolate an element from an adjacent element thereto because of the structure.

9 Claims, 14 Drawing Sheets

SEMICONDUCTOR DEVICE AND METHOD OF MANUFACTURING THEREOF

BACKGROUND OF THE INVENTION

1. Field of the Invention

The present invention relates to semiconductor devices, and more particularly, to a semiconductor device for improving element characteristics by improvement of the structure of a transistor and a method of manufacturing thereof.

2. Description of the Background Art

A VLSI (Very Large Scale Integrated Circuit) represented by a memory and a processor tends to be made large in scale recently. In order to meet with this requirement for a larger scale, a CMOS having features of high integration density and low power consumption has become the mainstream. However, such is the state that requirement for a higher speed is not sufficiently met even though an operating speed of a MOS has been enhanced because of progress of a miniaturization technique. From the view point of high speed, bipolar implementation centered at ECL (Emitter Coupled Logic) is usually the mainstream. However, power consumption of a bipolar device is extremely high, which imposes a great limit on high integration density.

Under these circumstances, in order to implement a device operable at a high speed with low power consumption, much attention has been paid to a Bi-CMOS transistor which can have CMOS's features of high integration density and low power consumption, and a bipolar implementation's feature of a high speed.

Referring to FIG. 15, a Bi-CMOS transistor 900 is often used in a peripheral circuit as a transistor for driving a memory cell 551 provided in a semiconductor device 550. An equivalent circuit of the Bi-CMOS transistor 900 is shown in FIG. 16.

A structure of the above-described Bi-CMOS transistor 900 is described in, for example, Japanese Patent Laying-Open No. 62-219554 and the like.

Referring to FIG. 17, an n− type epitaxial layer 502 is formed on a p− type semiconductor substrate of single crystal silicon.

An n+ type buried layer 503A of high concentration is formed extending over the semiconductor substrate 501 and the epitaxial layer 502 in a region where a bipolar transistor 600 is to be formed.

An n+ type buried layer 503B of high concentration is formed extending over the semiconductor substrate 501 and the epitaxial layer 502 in a region where a p channel MOS type field effect transistor 700 is to be formed.

The bipolar transistor 600 of the Bi-CMOS transistor 900 includes, as shown on the left side of FIG. 17, the n+ buried layer 503A, an n+ collector wall 507 of high concentration, the epitaxial layer 502, a p− base region 508, and an n+ emitter region 511 B of high concentration. The collector region includes the buried layer 503A, the collector wall 507 and the epitaxial layer 502. The collector wall 507 is connected to an electrode 515 for the collector wall through a connection hole 514 provided at an interlayer insulating layer 513. The base region 508 is electrically connected to the electrode 515 for base through the connection hole 514. The n+ emitter 511B is electrically connected to an emitter electrode 510B through a connection hole (with no reference numeral allotted) provided at a gate oxide film 509.

The p channel MOS type field effect transistor 700 of the Bi-CMOS transistor 900 includes, as shown in the center of FIG. 17, an n well of the n+ buried layer 503B, the n− epitaxial layer 502, the gate oxide film 509, a gate electrode 510A, and a pair of p+ source and p+ drain regions 512 of high concentration.

The n type well region has the bottom portion formed of the n+ buried layer 503B of high concentration. The n+ buried layer 503B is implemented to reduce the current amplifying rate of a parasitic bipolar transistor having the above-described well region as a base region to prevent a so-called latch up phenomenon of the parasitic bipolar transistor.

The p+ source region/p+ drain region 512 is electrically connected to the electrode 515 for source or drain through the connection hole 514.

Latch up is a phenomenon where pnp type and npn type parasitic bipolar transistors in a CMOS transistor implement a pnpn thyristor between power supply potential ($V_{DD}$) and ground potential GND ($V_{SS}$) in which an externally applied noise will cause continuous current flow between $V_{DD}$ and GND to induce breakdown of the CMOS transistor.

FIG. 18 is a sectional view schematically showing an example of a parasitic thyristor formed in the CMOS transistor of FIG. 17. If the impurity concentration of the n well 502 and the p well 506 is low in the CMOS transistor, the application of some surge noise will increase the voltage effect (voltage effect corresponding to resistors Rn and Rp) when current flows to these well regions. As a result, the parasitic pnp bipolar transistor Q1 and the parasitic npn bipolar transistor Q2 have their emitters and bases biased. The operation of these parasitic transistors will increase the possibility of the above-described latch up phenomenon.

An n channel MOS field effect transistor 800 of the Bi-CMOS transistor 900 includes, as shown on the right side of FIG. 17, a p+ buried layer 505A of high concentration, a p well 506 of low concentration, the gate oxide film 509, the gate electrode 510A, and n+ source region and n+ drain region 511A of high concentration. The p well 506 has its bottom portion formed of the p+ buried layer 505A of high concentration as well as the above-described n well. The p+ buried layer 505A is implemented to prevent the latch up phenomenon as well as the above.

The n+ source region and n+ drain region 511A is electrically connected to the electrode 515 for source or drain through the connection hole 514.

An isolation region is provided between the respective forming regions of the bipolar transistor 600, the p channel MOS type field effect transistor 700, and the n channel MOS type field effect transistor 800 which implement the above-described Bi-CMOS transistor 900.

The isolation region is formed of an isolation oxide film 504 provided on the main surface of the n− epitaxial layer 502, and a semiconductor region 505B for p+ isolation of high concentration contacting the bottom face of the isolation oxide film 504 and provided on the main surface of the n− epitaxial layer 502 at a position higher than that of the p+ buried layer 505A.

A method of manufacturing the above-described Bi-CMOS transistor 900 will now be described. FIGS. 19–21 are cross-sectional views of the Bi-CMOS transistor 900 in respective steps of the manufacturing process thereof in accordance with the cross-sectional structure shown in FIG. 17.

Referring to FIG. 19, the n+ buried layers 503A, 503B are formed on the forming regions of the bipolar transistor 600 and the p channel MOS type field effect transistor 700, respectively, of the main surface of the p− type semiconductor substrate 501. Then, the n− type epitaxial layer 502 is stacked on the main surface of the semiconductor substrate 501. At this time, because of heat for growth of the epitaxial layer 502, impurities in the n+ buried layers 503A, 503B are diffused into the epitaxial layer.

Referring to FIG. 20, the isolation oxide film 504 is formed at a predetermined position on the main surface of the epitaxial layer 502 between the forming regions of the semiconductor elements by using a LOCOS method. Then, the gate oxide film 509 is formed on the surface of the epitaxial layer 502.

Referring to FIG. 21, the p+ buried region 505A and the semiconductor region 505B for p+ isolation are formed at the main surface portion of the epitaxial layer 502 of the forming region of the n channel MOS type field effect transistor 800, and of the forming region of the isolation region, respectively.

The p+ buried region 505A, the semiconductor region 505B for p+ isolation, and the p well 506 are formed by a predetermined ion implantation using a resist film 516 (shown by a dot dash line in the figure). Then, the n+ collector wall 507, the p− base 508 and the n+ emitter 511B are formed in order in the forming region of the bipolar transistor 600.

In the forming region of the p channel MOS type field effect transistor 700, the gate electrode 510A, and the pair of p+ source region and p+ drain region 512 are formed in order.

In the forming region of the n channel MOS type field effect transistor 800, the gate electrode 510A, and the pair of n+ source region and n+ drain region 511A are formed in order.

After further forming the interlayer insulating film 513, the connection hole 514, and the respective electrodes 515 are formed. By carrying out the series of manufacturing steps, the Bi-CMOS transistor 900 is completed.

However, in the above-described structure, since isolation of the p channel MOS type field effect transistor 700 from the n channel MOS type field effect transistor 800 is insufficient, the parasitic thyristor element is rendered conductive, causing a large current flow to be produced between power supply terminals of a CMOS circuit and the like, the circuit operation to be hampered, and the semiconductor device itself to be destroyed. This is a so-called latch up phenomenon.

Referring to FIG. 22, FIG. 22 shows concentration distribution of impurities in cross-section taken along the line I—I of FIG. 17.

In the above-described prior art, the p+ buried layer 505A and a p+ channel stop layer 505B are simultaneously formed by a single impurity implantation, and the maximum value of concentration distribution of impurities is in the region (d1 in the figure) directly beneath the isolation oxide film 504. Therefore, concentration of impurities was lower at a position of the p+ channel stop deeper in the direction of depth of the substrate, which, in turn, caused insufficient isolation resulting in the above-described latch-up phenomenon.

SUMMARY OF THE INVENTION

An object of the present invention is to provide a semiconductor device for improving element isolation of elements formed in the semiconductor device.

Another object of the present invention is to improve the reliability of a semiconductor device having a Bi-MOS and Bi-CMOS structure formed in the semiconductor device.

A further object of the present invention is to provide a method of manufacturing a semiconductor device for improving element isolation of elements formed in a semiconductor device.

According to an aspect of the present invention, a semiconductor device includes a semiconductor substrate of a first conductivity type, an epitaxial layer of a second conductivity type formed on the main surface of the semiconductor substrate, an isolation oxide film formed to include an active region at the surface of the epitaxial layer, a first conductivity type well formed from the surface of the epitaxial layer of the active region to a predetermined depth, a first conductivity type channel stop layer having its periphery in contact with the bottom of the isolation oxide film and enclosing the bottom of the first conductivity type well, and having its bottom located higher than the main surface of the semiconductor substrate, and a first conductivity buried layer formed in a buried manner so that its top face is in contact with the bottom of the first conductivity channel stop layer, and its bottom positioned lower than the main surface of the semiconductor substrate.

Preferably, the first conductivity type channel stop layer has an impurity concentration of a first maximum value in the proximity of the bottom of the isolation oxide film, and the first conductivity type buried layer has an impurity concentration of a second maximum value in the proximity of the bottom of the first conductivity type channel stop layer.

According to another aspect of the present invention, a semiconductor device includes a semiconductor substrate of a first conductivity type, an epitaxial layer of a second conductivity type formed on the top face of the semiconductor substrate, a first conductivity type buried layer formed extending over the semiconductor substrate and the epitaxial layer, a first conductivity type channel stop layer formed at the upper layer of the first conductivity type buried layer, a first conductivity type well formed extending from the surface of the first conductivity type channel stop layer to the surface of the epitaxial layer, a gate electrode of a predetermined configuration formed on the surface of the first conductivity type well with an oxide film therebetween, and a pair of source/drain regions of a second conductivity type formed from the surface of the first conductivity type well to a predetermined depth.

According to a further aspect of the present invention, a semiconductor device includes a semiconductor substrate of a first conductivity type, an epitaxial layer of a second conductivity type formed at the main surface of the semiconductor substrate, an isolation oxide film formed to enclose a first active region at the surface of the epitaxial layer, a first MOS type field effect transistor having a first conductivity type channel region formed on the first active region, a second MOS type field effect transistor having a second conductive type channel region, and a bipolar transistor, wherein the second MOS field effect transistor and the bipolar transistor sandwich the first MOS field effect transistor and the isolation oxide film and are formed on a second active region. The first active region includes a first conductivity type well formed from the surface of the epitaxial layer to a predetermined depth, a first conductivity type channel stop layer having its periphery in contact with the bottom of the isolation oxide film and enclosing the bottom of the first conductivity type well, and having its bottom located higher than the main surface of the semiconductor substrate, and a first conductivity type buried layer formed in a buried manner so that the top face is in contact with the bottom of the first conductivity type channel stop layer and its bottom is positioned lower than the main surface of the semiconductor substrate.

According to still another aspect of the present invention, a semiconductor device includes a first MOS type field effect transistor having a channel region of a first conductivity type, a second MOS type field effect transistor having a channel region of a second conductivity type, and a bipolar transistor having a base region of a first conductivity type, a connector region of a second conductivity type and an emitter region. The first MOS type field effect transistor includes an epitaxial layer of a second conductivity type formed on a semiconductor substrate of a first conductivity type, a first conductivity type buried layer formed extending over the semiconductor substrate and the epitaxial layer, a first conductivity type channel stop layer formed at the upper layer of the first conductivity type buried layer, a first conductivity type well formed from the top face of the first conductivity type channel stop layer to the surface of the epitaxial layer, a gate electrode of a predetermined configuration formed at the top face of the first conductivity type well with an oxide film therebetween, and a pair of source/drain regions of a second conductivity type formed from the surface of the first conductivity type well to a predetermined depth.

From the above structure, the active region enclosed by the isolation oxide film is also enclosed in the depth direction of the substrate by the first conductivity type channel stop layer and the first conductivity type buried layer, whereby isolation from other elements is ensured. When the above-described structure is applied to a CMOS structure, for example, formation of a parasitic bipolar transistor is prevented to prevent latch up phenomenon.

According to a still further aspect of the present invention, a method of manufacturing a semiconductor device includes the steps of forming an epitaxial layer of a second conductivity type of a predetermined thickness at the surface of a semiconductor substrate of a first conductivity type, forming an isolation oxide film enclosing the active region of the main surface of the epitaxial layer of the second conductivity type, forming in a buried manner a first conductivity type buried layer at a region extending over the semiconductor substrate in the active region and the epitaxial layer by implanting impurities of a first conductivity type under a predetermined condition, forming a first conductivity type channel stop layer at the upper layer of the first conductivity type buried layer by implanting impurities of the first conductivity type under a predetermined condition, forming a first conductivity type well from the upper layer of the first conductivity type channel stop layer and the surface of the epitaxial layer by implanting impurities of the first conductivity type under a predetermined condition.

According to yet a further aspect of the present invention, a method of manufacturing a semiconductor device includes the steps of forming an epitaxial layer of a second conductivity type of a predetermined thickness at the surface of a semiconductor substrate of a first conductivity type by a CVD method, and forming a first conductivity type buried layer at a region extending over the semiconductor substrate and the epitaxial layer by implanting impurities of a first conductivity type under a predetermined condition.

According to the above-described manufacturing method of a semiconductor device of the present invention, the first conductivity type buried layer, the first conductivity type channel stop layer, and the first conductivity type well can be formed continuously at the same process by changing the implanting amount of impurities and the implanting energy.

Thus, a semiconductor device can be manufactured at a low cost in comparison with a conventional case without significantly increasing the number of manufacturing steps thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the Bi-CMOS transistor according to the present invention will now be described hereinafter with reference to the drawings.

Figure 1:
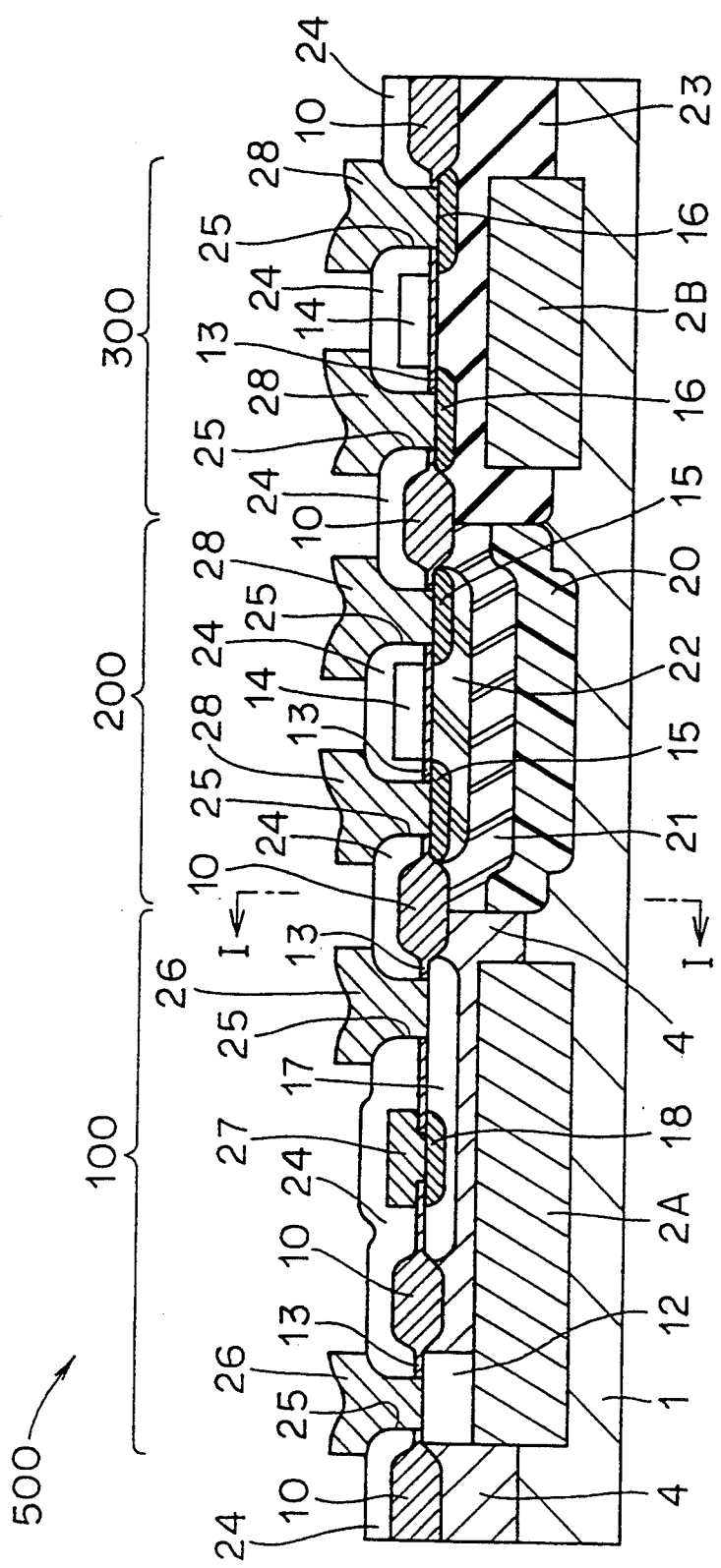
FIG. 1 is a cross-sectional view of a semiconductor device according to the present invention.

Referring to FIG. 1, a Bi-CMOS transistor 500 according to the embodiment is implemented on the same substrate with an npn type bipolar transistor 100, an n channel MOS type field effect transistor 200, and a p channel MOS type field effect transistor 300.

An n⁻ epitaxial layer 4 having a thickness of about 0.9–1.5 μm, a resistivity of about 0.1–3.0Ω·cm is formed on a p type semiconductor substrate 1.

An n⁺ buried layer 2A having an impurity concentration of $1 \times 10^{17}$–$1 \times 10^{21}$ cm$^{-3}$ is formed extending over the semiconductor substrate 1 and the n⁻ epitaxial layer 4 in the forming region of the npn bipolar transistor 100, which intends to reduce a resistance of the collector region of the bipolar transistor.

An n⁺ buried layer 2B having an impurity concentration of $1 \times 10^{17}$–$1 \times 10^{21}$ cm$^{-3}$ is formed extending over the semiconductor substrate 1 and the n⁻ epitaxial layer 4 in the forming region of the p channel MOS type field effect transistor 300. The buried layer is provided to reduce a resistance of the well to prevent a latch up phenomenon.

The npn bipolar transistor 100 includes the n⁺ buried layer 2A, an n⁺ collector wall 12 of an impurity concentration of $1 \times 10^{17}$–$1 \times 10^{21}$ cm$^{-3}$, the n⁻ epitaxial layer 4 of an impurity concentration of $1 \times 10^{15}$–$1 \times 10^{17}$ cm$^{-3}$, a p⁻ base 17 of an impurity concentration of $1 \times 10^{16}$–$1 \times 10^{19}$ cm$^{-3}$ and the n⁺ emitter 18 of an impurity concentration of $1 \times 10^{18}$–$1 \times 10^{21}$ cm$^{-3}$. The collector region of the bipolar transistor 100 includes the n⁺ buried layer 2A, the n⁺ collector wall 12, and the n⁻ epitaxial layer 4. The n⁺ collector wall 12 is connected to a collector electrode 26 through a connection hole 25 provided in an interlayer insulating film 24. The p⁻ base 17 is electrically connected to the electrode 26 for base through the connection hole 25. The n⁺ emitter 18 is electrically connected to an emitter electrode 27 through a connection hole (without no reference numeral allotted) provided in a gate oxide film 13.

The p channel MOS type field effect transistor 300 of the Bi-CMOS transistor 500 includes an n⁺ buried layer 2B, an n well 23 of an impurity concentration of $1 \times 10^{15}$–$1 \times 10^{18}$ cm$^{-3}$, the gate oxide film 13, a gate electrode 14, and a pair of p⁺ source/drain regions 16 of an impurity concentration of $1 \times 10^{18}$–$1 \times 10^{21}$ cm$^{-3}$. The n well 23 has its bottom portion formed of the n⁺ buried layer 2B of high concentration. The n⁺ buried layer 2B is implemented so as to reduce the current amplifying rate of the parasitic bipolar transistor having the n well 23 as the base region to prevent the so-called latch up phenomenon. The p⁺ source/drain regions 16 are electrically connected to the electrode 28 for source or drain through the connection hole 25.

The n channel MOS field effect transistor 200 of the Bi-CMOS 500 includes a p⁺ buried layer 20 of an impurity concentration of $1 \times 10^{16}$–$1 \times 10^{19}$ cm$^{-3}$, a p⁺ channel stop layer 21 of an impurity concentration of $1 \times 10^{16}$–$1 \times 10^{19}$ cm$^{-3}$, a p well 22 of an impurity concentration of $1 \times 10^{15}$–$1 \times 10^{18}$ cm$^{-3}$, the gate oxide film 13, the gate electrode 14, and n⁺ source/drain regions 15 of an impurity concentration of $1 \times 10^{18}$–$1 \times 10^{21}$ cm$^{-3}$. The p well 22 has its bottom portion formed of the p⁺ channel stop layer 21. The bottom portion of the p⁺ channel stop layer 21 is formed of the p⁺ buried layer 20 of an impurity concentration of $1 \times 10^{16}$–$1 \times 10^{19}$ cm$^{-3}$ to prevent the latch up phenomenon. The n⁺ source/drain regions 15 are electrically connected to the electrode 28 for source or drain through the connection hole 25.

A method of manufacturing the above-described Bi-CMOS transistor 500 will now be described. FIGS. 2–9 are cross-sectional views of the Bi-CMOS transistor 500 in respective steps of the manufacturing process in accordance with a cross-sectional structure shown in FIG. 1.

Figure 2:
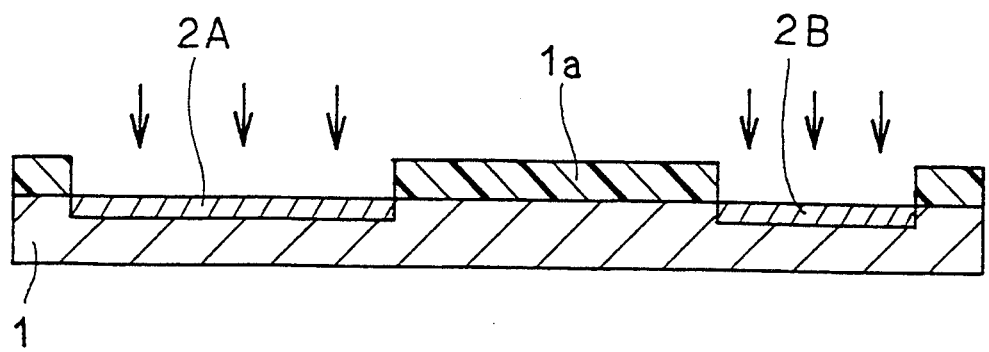
FIGS. 2-9 show cross-sectional views of the first to the eighth steps of a first embodiment of a method of manufacturing the semiconductor device according to the present invention.

Referring to FIG. 2, a resist film 1a of a predetermined shape is formed on the surface of the p⁻ type semiconductor substrate 1. With the resist film 1a used as a mask, impurities such as arsenic, antimony or the like is implanted under the condition of energy of about 50 keV and an amount of about $1 \times 10^{15}$–$1 \times 10^{16}$ cm$^{-2}$, to form the n⁺ buried layers 2A, 2B.

Figure 3:
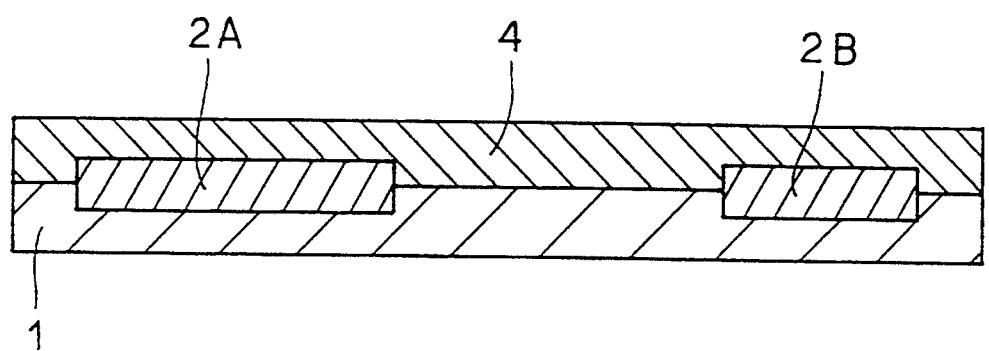

Referring to FIG. 3, after removing the resist film 1a, the epitaxial layer 4 including n type impurities such as phosphorus (P) having concentration of $1 \times 10^{15}$–$1 \times 10^{17}$ cm$^{-3}$ is formed to have a thickness of 0.9–1.5 μm, and a resistivity of 0.1–3.0Ω·cm. At this time, along with growth of the epitaxial layer 4, the above-described n⁺ buried layers 2A, 2B are diffused into the epitaxial layer 4.

Figure 4:
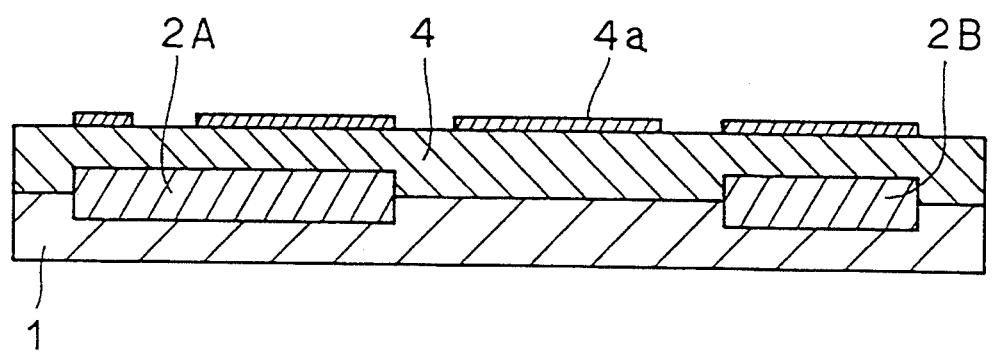
Figure 5:
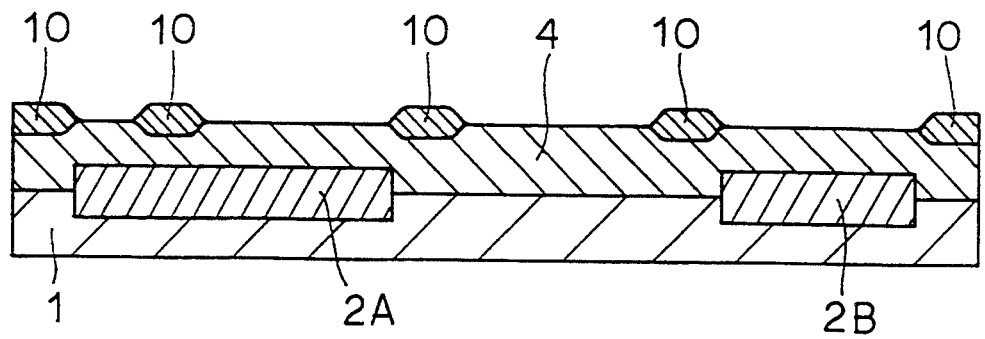
Figure 6:
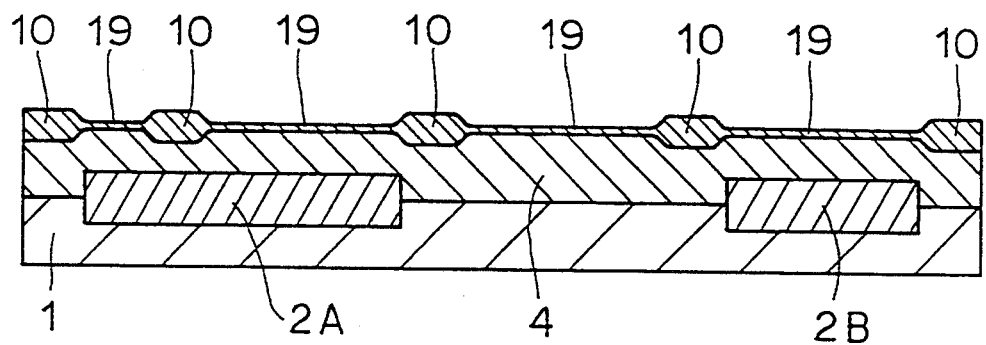

Referring to FIG. 4, a nitride film 4a of a predetermined shape is formed on the main surface of the epitaxial layer 4 in the forming region of the semiconductor element. Referring to FIG. 5, with the nitride film 4a used as a mask, an isolation oxide film 10 of SiO₂ of a thickness of about 5000 Å is then formed at a predetermined position by using a LOCOS method. Referring to FIG. 6, a gate oxide film 19 is further provided on the entire surface of the epitaxial layer 4 by thermal oxidation.

Figure 7:
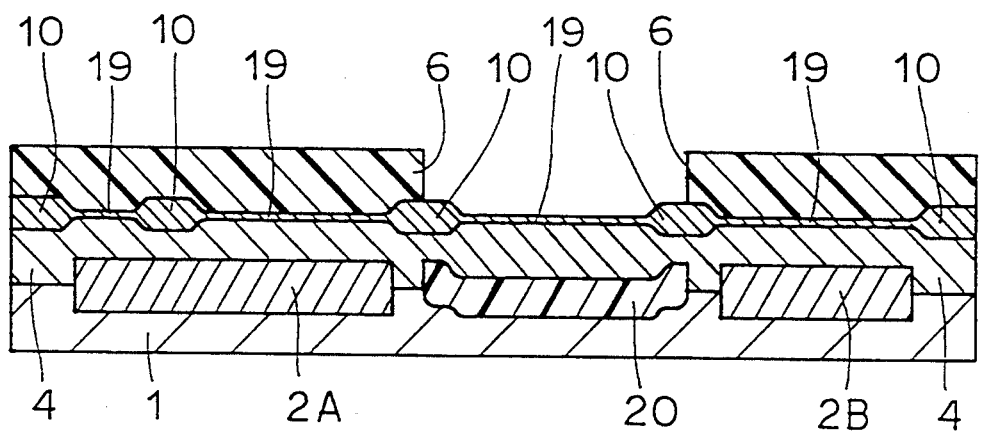

Referring to FIG. 7, a resist film 6 is formed in the forming region of the npn bipolar transistor 100 and the p channel MOS type field effect transistor 300. With the resist film 6 used as a mask, p type impurities such as boron are implanted at energy of about 250 keV–1200 keV and an implantation amount of $1 \times 10^{12}$–$1 \times 10^{14}$ cm$^{-2}$ in the region extending over the above-described semiconductor substrate 1 and the epitaxial layer 2 to form the p⁺ buried layer 20 of an impurity concentration of $1 \times 10^{16}$–$1 \times 10^{19}$ cm$^{-3}$.

Figure 8:
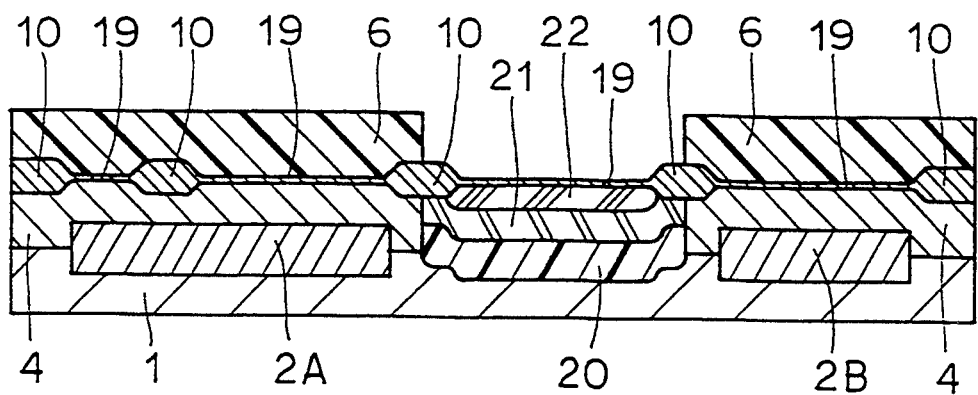

Referring to FIG. 8, with the above-described resist film 6 used as a mask, p type impurities such as boron are further implanted under the condition of implantation energy of about 100 keV–250 keV and an implantation amount of $1 \times 10^{12}$–$1 \times 10^{14}$ cm$^{-2}$ on the upper layer of the above-described p⁺ buried layer 20 to form the p⁺ channel stop layer 21 of an impurity concentration of $1 \times 10^{16}$–$1 \times 10^{19}$ cm$^{-3}$. At this time, the p⁺ channel stop layer 21 is formed at the bottom surface of the isolation oxide film 10.

With the above-described resist film 6 used as a mask, p type impurities such as boron are further implanted at energy of 50–200 keV and an implantation amount of $1 \times 10^{12}$–$1 \times 10^{14}$ cm$^{-2}$ from the top face of the above-described p⁺ channel stop layer 21 to the main surface of the n⁻ epitaxial layer 4 to form the p well 22 of an impurity concentration of $1 \times 10^{15}$–$1 \times 10^{18}$ cm$^{-3}$.

Figure 9:
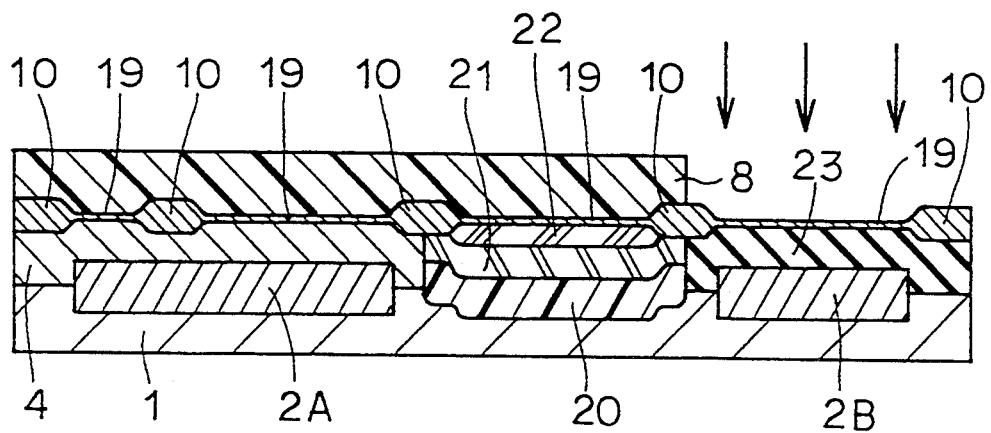

Referring to FIG. 9, after removing the above-described resist film 6, a resist film 8 is newly formed on the substrate surface of the region where the npn bipolar transistor 100 and the n channel MOS type field effect transistor 200 are to be formed. With the resist film 8 used as a mask, n type impurities such as phosphorus are implanted at energy of 50–200 keV and an implantation amount of $1 \times 10^{12}$–$1 \times 10^{14}$ cm$^{-2}$ from the above-described n+ buried layer 2B of the forming region of the p channel MOS type field effect transistor to the surface of the epitaxial layer 4 to form the n well 23 of an impurity concentration of $1 \times 10^{15}$–$1 \times 10^{18}$ cm$^{-3}$. Then in the forming region of the npn bipolar transistor 100, the n+ collector wall 12, the p− base 17 and the n+ emitter 18 are sequentially formed.

In the forming region of the n channel MOS type field effect transistor 200, the gate electrode 14, and the pair of n+ source/drain regions 15 of an impurity concentration of $1 \times 10^{18}$–$1 \times 10^{21}$ cm$^{-3}$ are formed sequentially. In the forming region of the p channel MOS type field effect transistor 300, the gate electrode 14 and the pair of p+ source/drain regions 16 of an impurity concentration of $1 \times 10^{18}$–$1 \times 10^{21}$ cm$^{-3}$ are sequentially formed. Furthermore, after forming the interlayer insulating film 24 and the connection hole 25, respective electrodes 26, 27 and 28 are formed. By carrying out the series of manufacturing steps, the Bi-CMOS according to the present invention is completed.

Figure 10:
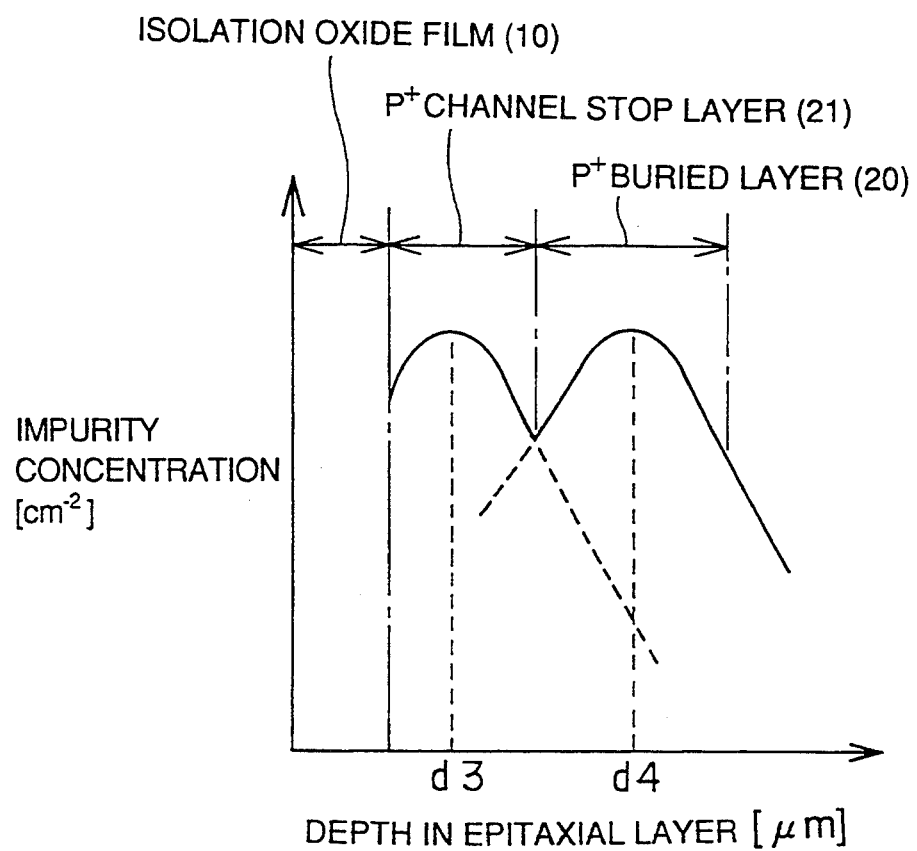
FIG. 10 shows concentration of impurities as a function of depth in the epitaxial layer in cross-section taken along the line I—I of FIG. 1.
Figure 22:
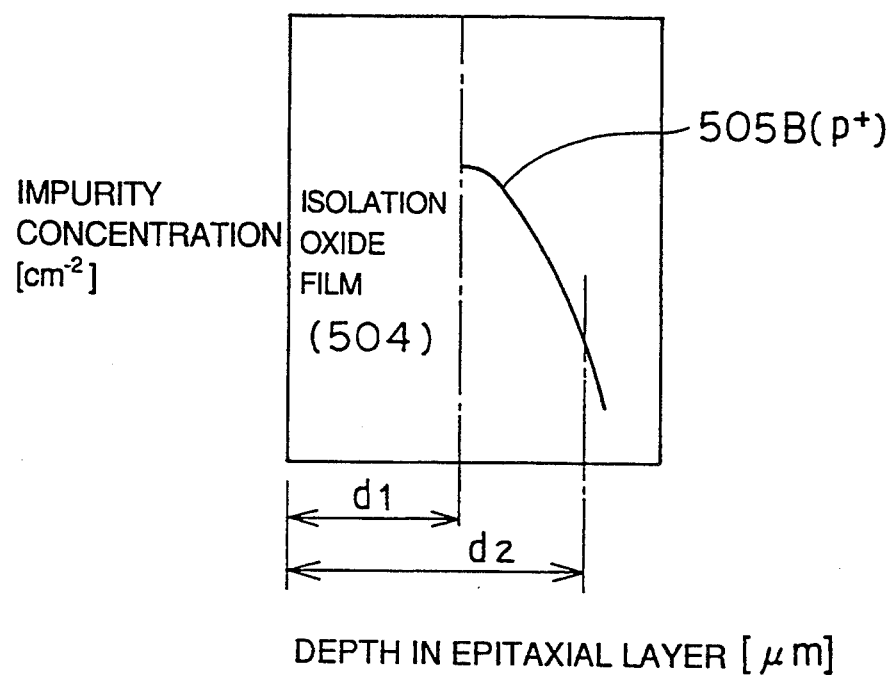
FIG. 22 shows concentration of impurities as a function of depth in the epitaxial layer in cross-section taken along the line I—I of FIG. 17.

Referring to FIG. 10, concentration distribution of impurities as a function of depth in the epitaxial layer in cross-section taken along the line I—I of FIG. 1 is shown. In this embodiment, the p+ channel stop layer 21 is formed directly beneath the region of the isolation oxide film 10, and the p+ buried layer 20 is further formed at the lower portion. Since the layers are formed by respective ion implantations, the implantation amount of impurities in each layer is sufficient to make isolation from the adjacent npn bipolar transistor 100 and p channel MOS type field effect transistor 300. As shown in FIG. 10, it can be seen that impurity concentrations at depth d3 and depth d4 in the epitaxial layer are sufficient when compared to FIG. 22 shown with regard to the prior art.

Since formation of the above-described p+ buried layer 20 and the p+ channel stop layer 21 can be carried out in a series of steps by only changing amounts and energy in implanting ions, each layer can be easily formed compared to the conventional manufacturing steps, and the manufacturing steps can be reduced.

A structure of a semiconductor device according to a second embodiment of the present invention will now be described.

Figure 11:
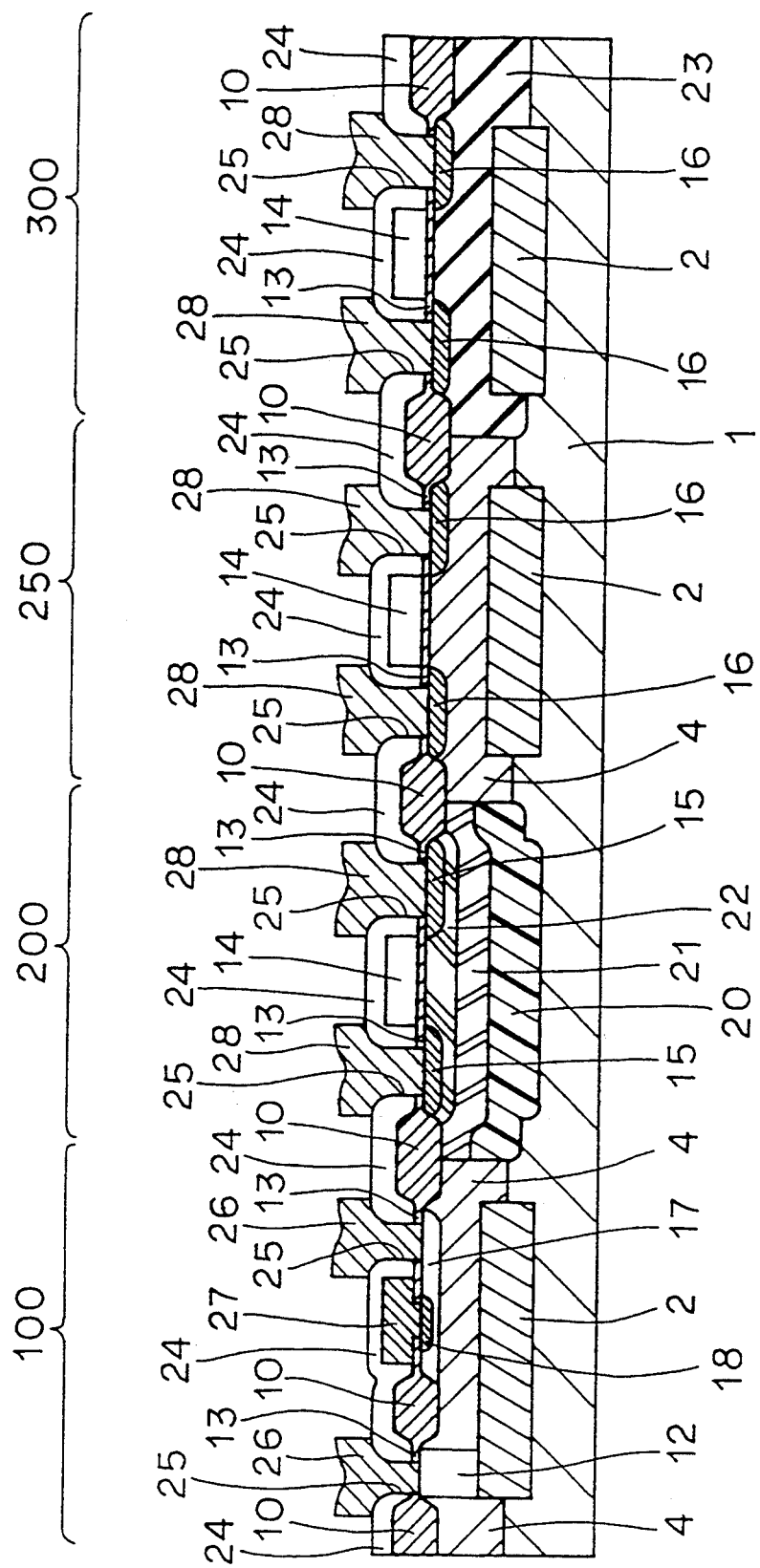
FIG. 11 is a cross-sectional view of a second embodiment of the semiconductor device according to the present invention.

Referring to FIG. 11, the semiconductor device according to the second embodiment, when compared to the Bi-CMOS transistor 500 in the first embodiment, a p channel MOS type field effect transistor 250 having the n− epitaxial layer 4 of an impurity concentration of $1 \times 10^{15}$–$1 \times 10^{17}$ cm$^{-3}$ as its well is further formed between the n channel MOS type field effect transistor 200 and the p channel MOS type field effect transistor 300. The p channel MOS type field effect transistor 250 is lower in the impurity concentration than the n well of the above-described p channel MOS type field effect transistor 300 because the well is constituted of the n− epitaxial layer 4 as describe above. As a result, it is possible to implement an MOS transistor having a low threshold voltage, thereby making it possible to form two kinds of MOS transistors having different threshold voltages.

Figure 12:
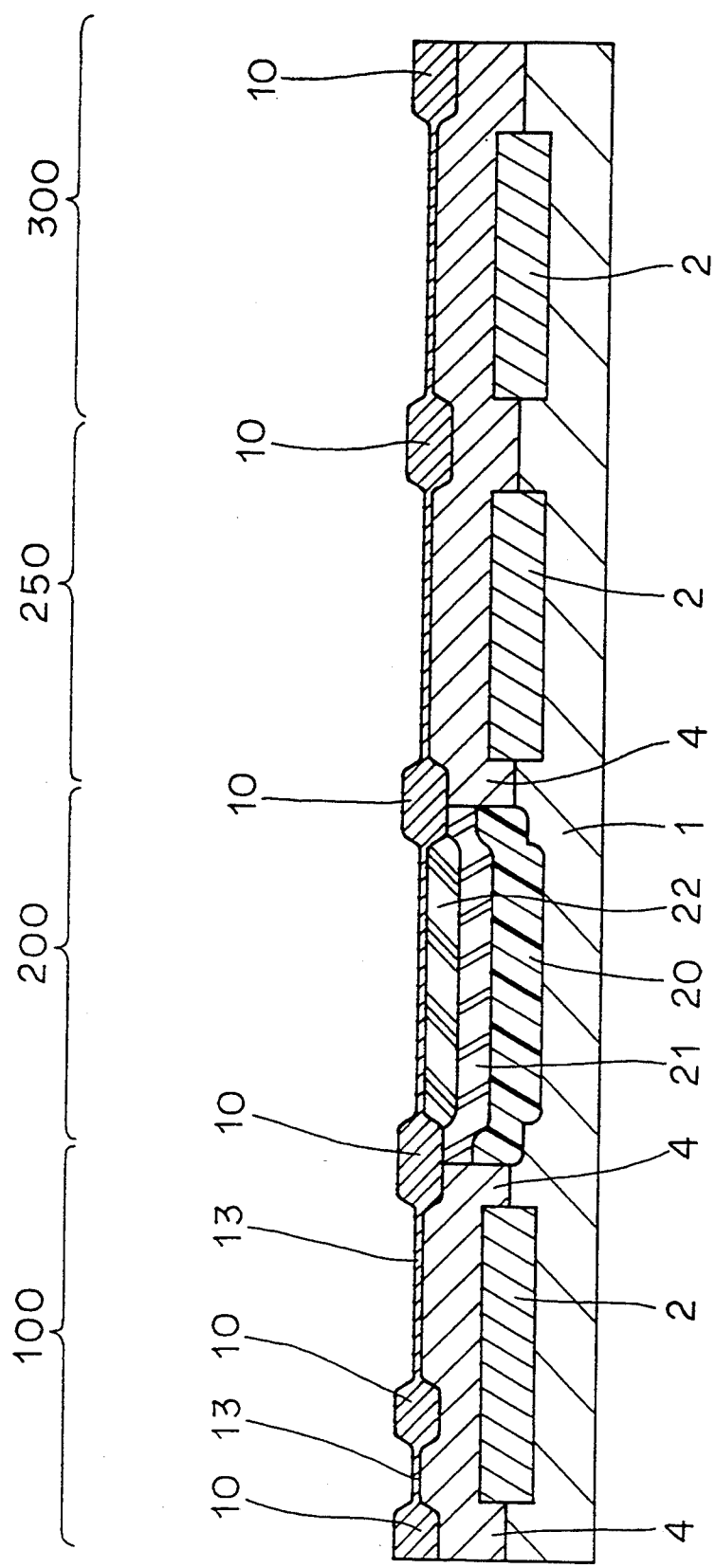
FIGS. 12 and 13 are cross-sectional views showing the first and the second steps of the second embodiment of a method of manufacturing the semiconductor device according to the present invention.
Figure 13:
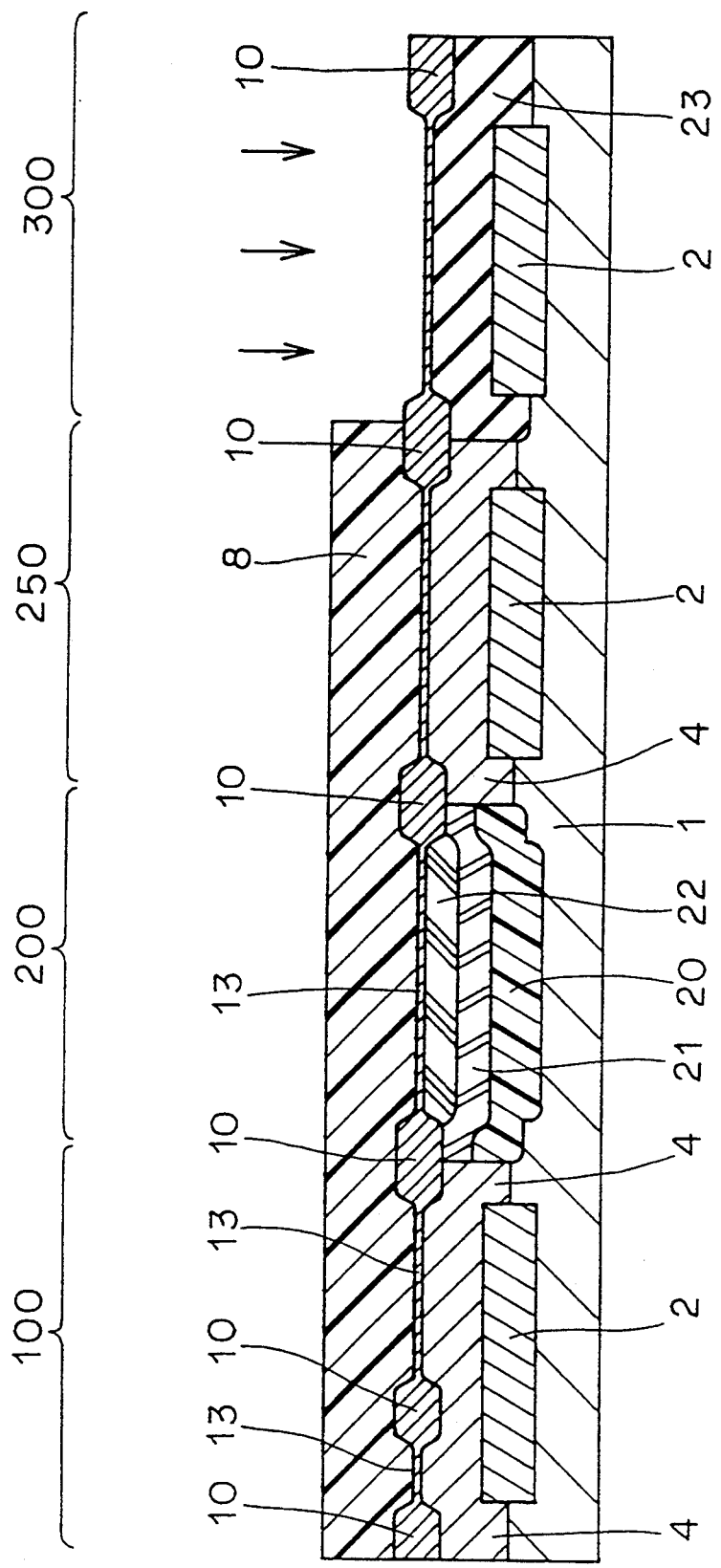

A method of manufacturing the semiconductor devices according to the second embodiment will now be described. FIGS. 12 and 13 are cross-sectional views showing steps in order of manufacturing the semiconductor device according to a cross-sectional structure shown in FIG. 11.

Referring to FIG. 12, FIG. 12 shows the state where the resist film 6 is removed from FIG. 8 described in the manufacturing steps of the Bi-CMOS transistor according to the above-described first embodiment. Two forming regions of n channel MOS type field effect transistors 250, 300 are provided.

Referring to FIG. 13, with the regions covered with the resist film 8 where the npn bipolar transistor 100, the n channel MOS type field effect transistor 200, and the p channel MOS field effect transistor 250 are to be respectively formed, n type impurities such as phosphorus are implanted at energy of 50–200 keV and an implantation amount of $1 \times 10^{12}$–$1 \times 10^{14}$ cm$^{-2}$ in the forming region of the p channel MOS type field effect transistor 300 to form the n well 23 of an impurity concentration of $1 \times 10^{15}$–$1 \times 10^{18}$ cm$^{-3}$.

As described above, by covering the forming region of the p channel MOS type field effect transistor 250 with the resist film, it is possible to manufacture a p channel MOS type field effect transistor having different threshold voltages easily.

In each of the above-described embodiments, although a Bi-CMOS having an n− epitaxial layer formed on a p type substrate and having an npn type bipolar transistor was described, the same effect can be obtained with a Bi-CMOS having a p− type epitaxial layer formed on an n type semiconductor substrate and having a pnp type bipolar transistor. The same effect can also be obtained with a bipolar transistor having the emitter and the base of a self-alignment structure.

The structure of a semiconductor device according to a third embodiment of the present invention will be described hereinafter. In comparison with the above described first and second embodiments where one bipolar transistor and a plurality of MOS field effect transistors are described, a semiconductor device having a structure of one npn bipolar transistor 100 and one p channel MOS field effect transistor 300 will be described in the third embodiment.

Figure 14:
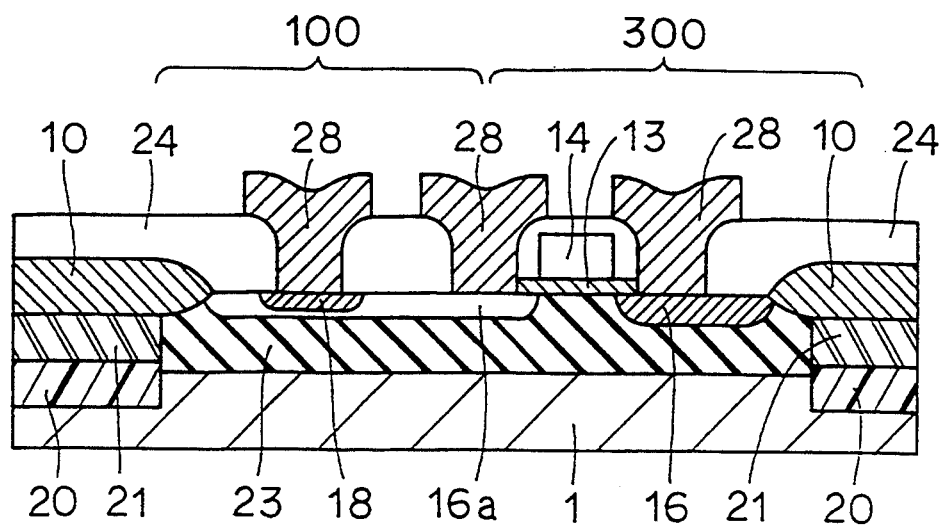
FIG. 14 is a sectional view of a semiconductor device according to a third embodiment of the present invention.
Figure 15:
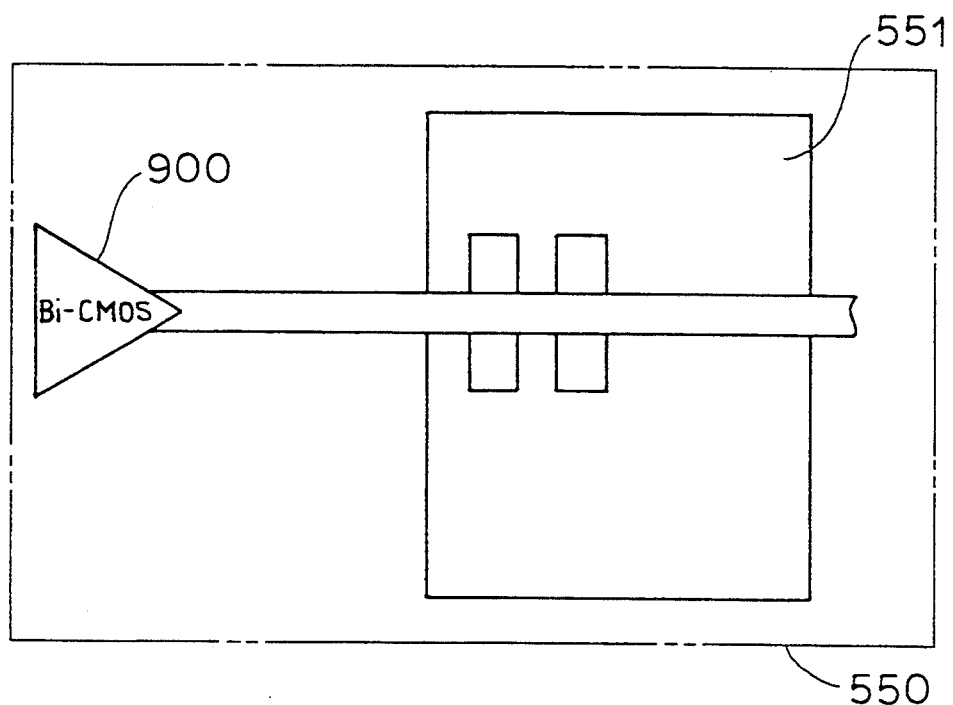
FIG. 15 is a plan model diagram showing the entire structure of the semiconductor device.
Figure 16:
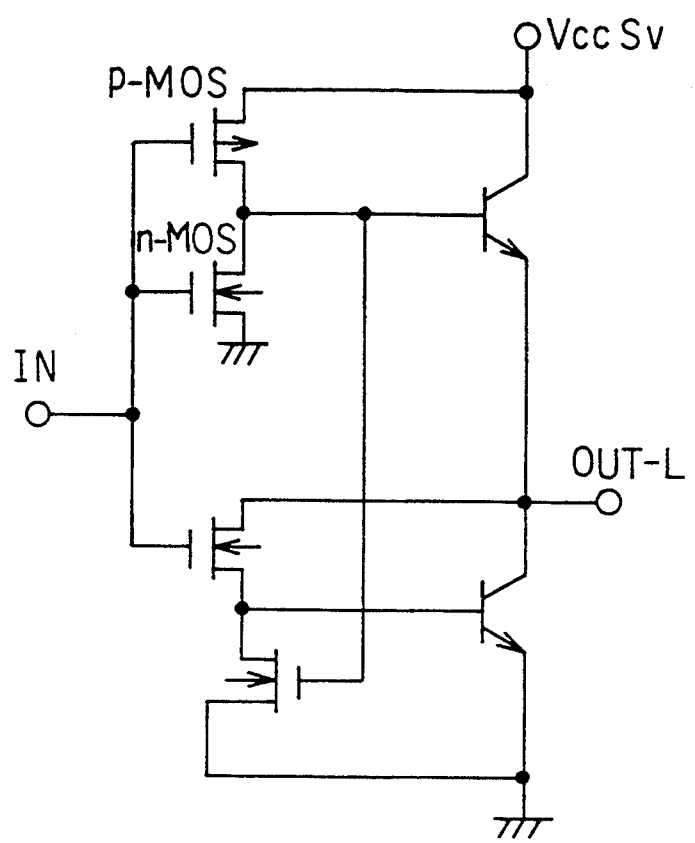
FIG. 16 is a diagram showing an equivalent circuit of the semiconductor device.
Figure 17:
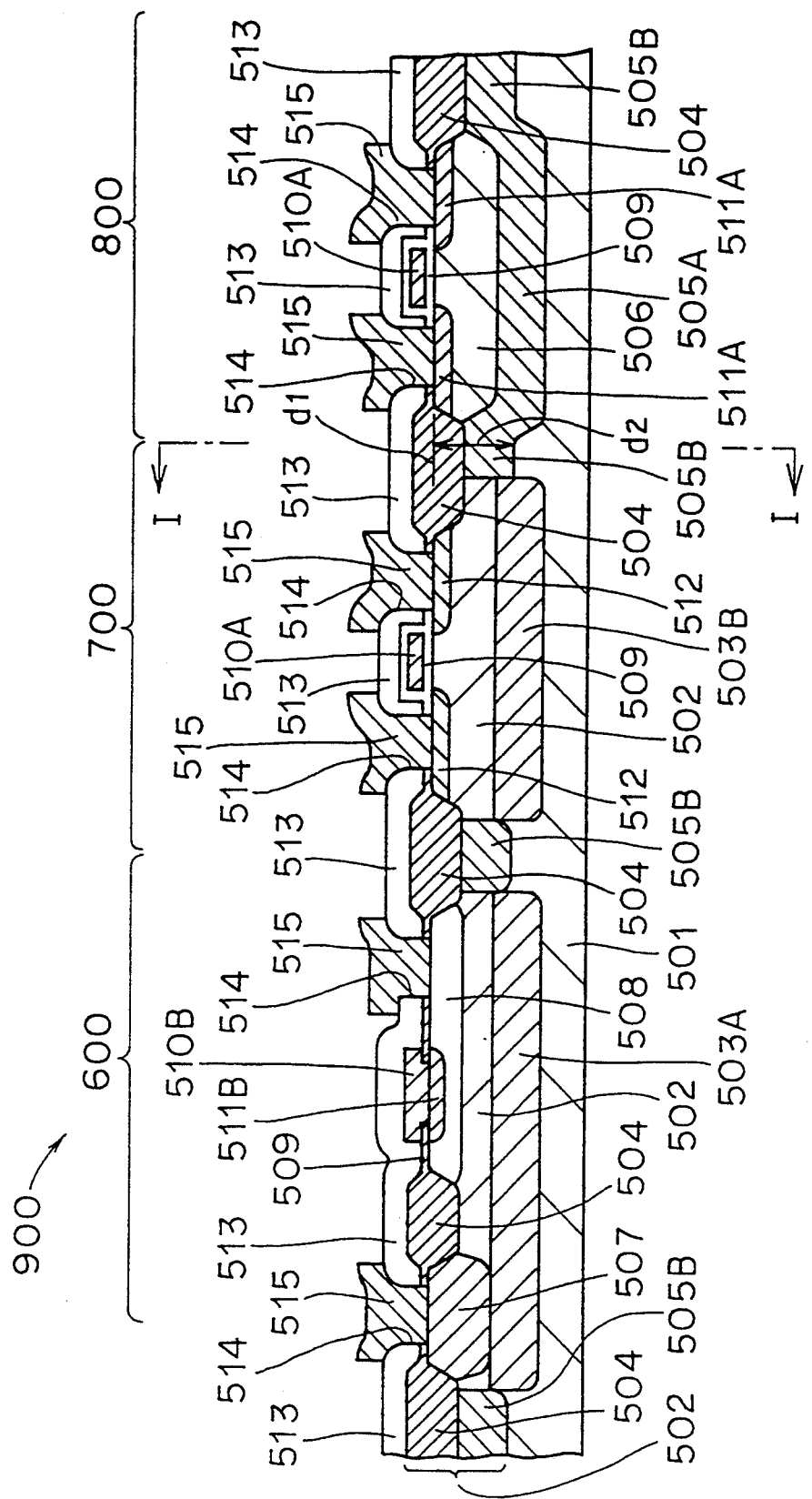
FIG. 17 is a cross-sectional view of a conventional semiconductor device.
Figure 18:
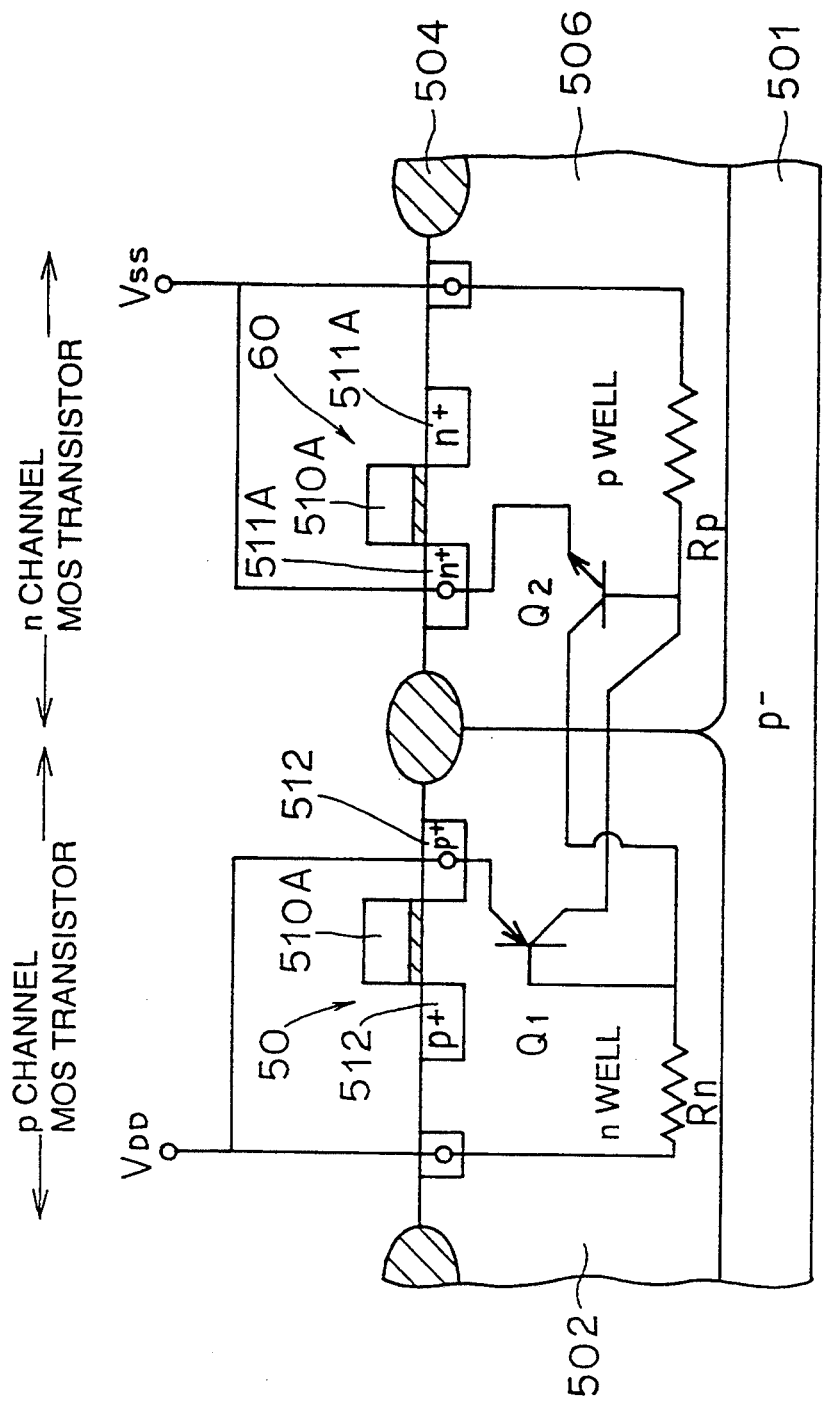
FIG. 18 schematically shows a latch up phenomenon of a CMOS type transistor.
Figure 19:
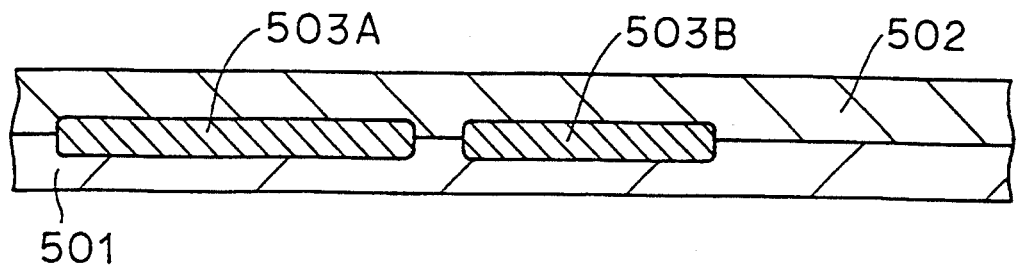
FIGS. 19-21 are cross-sectional views showing the first to the third steps of a method of manufacturing the conventional semiconductor device.
Figure 20:
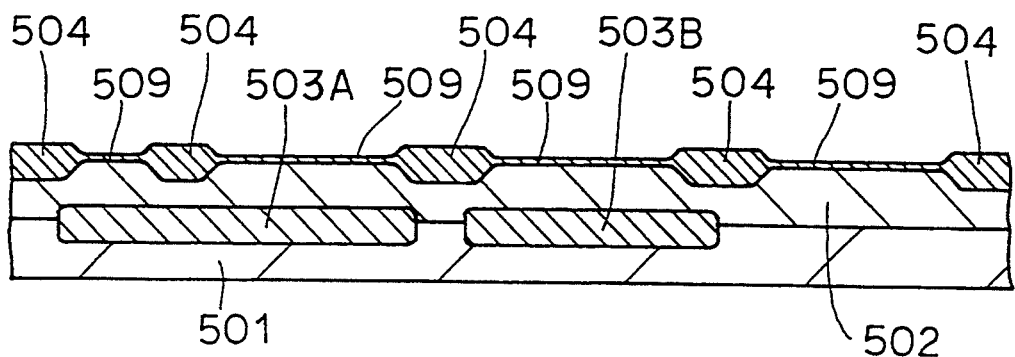
Figure 21:
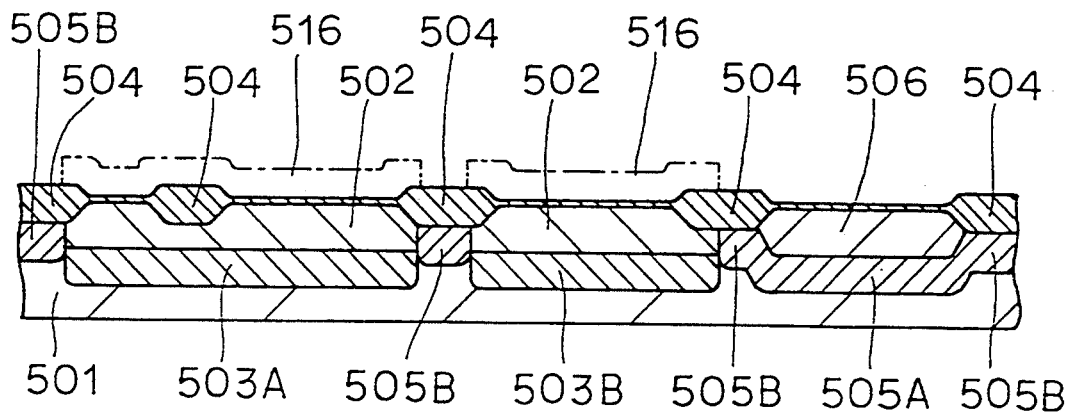

Referring to FIG. 14, an n well 23 of an n− epitaxial layer having the thickness of approximately 0.9–1.5 μm and a resistivity of approximately 0.1–3.0Ω·cm is formed on a p type semiconductor substrate.

At a predetermined position of the surface of the n well 23, an isolation oxide film 10 is formed so as to enclose an active region in which an npn bipolar transistor 100 and an p channel MOS type field effect transistor 300 are formed. Right beneath the isolation oxide film 10 extending over the p type semiconductor substrate 1 and the n well 23, a p type buried layer 20 of an impurity concentration of $1 \times 10^{16}$–$1 \times 10^{19}$ cm$^{-3}$ is formed. A p+ channel stop layer 21 of an impurity concentration of $1 \times 10^{16}$–$1 \times 10^{19}$ cm$^{-3}$ is formed from the surface of the p buried layer 20 to the region below the isolation oxide film 10.

The npn bipolar transistor 100 includes an n+ emitter 18 of an impurity concentration of $1 \times 10^{18}$–$1 \times 10^{21}$ cm$^{-3}$, and a base region 16a in common to the p+ source/drain region of the p channel MOS type field effect transistor. The P channel MOS type field effect transistor 300 has a gate electrode 14 formed at the surface of the n well 23 with a gate oxide film 13 therebetween. The p+ source/drain regions 16 and 16a are formed to sandwich the gate electrode 14. An electrode 28 is formed in the p+ source/drain region 16 and 16a and the n+ emitter 18 with an interlayer insulating film 24 therebetween.

As shown in the above-described embodiment, the provision of a p+ buried layer and of a p+ channel stop layer right beneath the isolation oxide film 10 will result in a profile of an impurity concentration in this region equal to that shown in FIG. 10, whereby element isolation can be sufficiently ensured even in the depth direction of the substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor substrate of a first conductivity type;
    an epitaxial layer of a second conductivity type formed on the main surface of the semiconductor substrate;
    an isolation oxide film formed surrounding an active region in the surface of the epitaxial layer;
    a well of a first conductivity type formed having a predetermined depth from the surface of said epitaxial layer of said active region;
    a channel stop layer of a first conductivity type formed having the peripheral top portion contacting the bottom face of said isolation oxide film, surrounding the bottom face of said well of a first conductivity type, and having the bottom face of said channel stop layer of a first conductivity type positioned higher than the main surface of said semiconductor substrate; and
    a buried layer of a first conductivity type buried having the top face contacting the bottom face of said channel stop layer of a first conductivity type and the bottom face of said buried layer of a first conductivity type positioned lower than the main surface of said semiconductor substrate,
    wherein the well has a peak impurity concentration located at a depth below its top face and above its bottom face, the channel stop layer has a peak impurity concentration located at a depth below its top face and above its bottom face, and the buried layer has a peak impurity concentration located at a depth below its top face and above its bottom face, and
    further wherein the bottom face of the well and the top face of the channel stop layer are located where a decrease in the impurity concentration from the maximum in the well ends and an increase in the impurity concentration toward the maximum in the channel stop layer begins, and the bottom face of the channel stop layer and the top face of the buried layer are located where a decrease in the impurity concentration from the maximum in the channel stop layer ends and an increase in the impurity concentration toward the maximum in the buried layer begins.

2. The semiconductor device according to claim 1, wherein said first conductivity type channel stop layer comprises an impurity concentration of a first maximum value in the proximity of the bottom of said isolation oxide film,
    wherein said first conductivity type buried layer comprises an impurity concentration of a second maximum value in the proximity of the bottom of said first conductivity type channel stop layer.

3. The semiconductor device according to claim 1, further comprising:
    a pair of impurity diffusion regions of a second conductivity type formed at a predetermined space having a predetermined depth from the surface of said well of a first conductivity type; and
    a conductive layer formed on a position sandwiched by said pair of impurity diffusion regions of a second conductivity type on the surface of said well of a first conductivity type with an oxide film interposed therebetween.

4. The semiconductor device according to claim 3, wherein
    said pair of impurity diffusion regions of a second conductivity type and said conductive layer constitute a source/drain region and a gate electrode of a MOS type field effect transistor, respectively.

5. The semiconductor device according to claim 1, wherein
    said well of a first conductivity type includes an impurity concentration of $1 \times 10^{15}$ cm$^{-3}$–$1 \times 10^{18}$ cm$^{-3}$,
    said channel stop layer of a first conductivity type includes an impurity concentration of $1 \times 10^{16}$ cm$^{-3}$–$1 \times 19$ cm$^{-3}$, and
    said buried layer of a first conductivity type includes an impurity concentration of $1 \times 10^{16}$ cm$^{-3}$–$1 \times 19$ cm$^{-3}$.

6. A semiconductor device comprising:
    a semiconductor substrate of a first conductivity type;
    an epitaxial layer of a second conductivity type formed on the main surface of the semiconductor substrate;
    an isolation oxide film formed surrounding a first active region in the surface of the epitaxial layer;
    a first MOS type field effect transistor having a channel region of a first conductivity type and formed on said first active region;
    a second MOS type field effect transistor having a channel region of a second conductivity type, and a bipolar transistor both formed on a second active region sandwiching the first MOS type field effect transistor and said isolation oxide film so as to be adjacent to one another, wherein
    said first active region includes
    a well of a first conductivity type formed having a predetermined depth from the surface of said epitaxial layer,
    a channel stop layer of a first conductivity type formed having the peripheral top portion contacting the bottom face of said isolation oxide film, surrounding the bottom face of said well of a first conductivity type, and having the bottom face of said channel stop layer of a first conductivity type positioned higher than the main surface of said semiconductor substrate, and
    a buried layer of a first conductivity type buried having the top face contacting the bottom face of said channel stop layer of a first conductivity type and the bottom face of said buried layer of a first conductivity type positioned lower than the main surface of said semiconductor substrate,
    wherein the well has a peak impurity concentration located at a depth below its top face and above its bottom face, the channel stop layer has a peak impurity concentration located at a depth below its top face and above its bottom face, and the buried layer has a peak impurity concentration located at a depth below its top face and above its bottom face, and further wherein the bottom face of the well and the top face of the channel stop layer are located where a decrease in the impurity concentration from the maximum in the well ends and an increase in the impurity concentration toward the maximum in the channel stop layer begins, and the bottom face of the channel stop layer and the top face of the buried layer are located where a decrease in the impurity concentration from the maximum in the channel stop layer ends and an increase in the impurity concentration toward the maximum in the buried layer begins.

7. The semiconductor device according to claim 6, wherein said bipolar transistor includes an emitter region of a second conductivity type formed in the surface of said epitaxial layer, a base region of a first conductivity type formed surrounding the emitter region, and a collector region formed of said epitaxial layer of a second conductivity type positioned lower than the base region.

8. The semiconductor device according to claim 6, wherein said second MOS type field effect transistor having the channel region of a second conductivity type includes a well of a second conductivity type formed having a predetermined depth from the surface of said epitaxial layer, a pair of impurity diffusion regions of a first conductivity type formed at a predetermined space having a predetermined depth from the surface of the well of a second conductivity type, and a conductive layer formed on a position sandwiched by said pair of impurity diffusion regions of a first conductivity type on the surface of said well of a second conductivity type with an oxide film interposed therebetween.

9. The semiconductor device according to claim 6, wherein said well of a first conductivity type includes an impurity concentration of $1 \times 10^{15}$ cm$^{-3}$–$1 \times 10^{18}$ cm$^{-3}$, said channel stop layer of a first conductivity type includes an impurity concentration of $1 \times 10^{16}$ cm$^{-3}$–$1 \times 10^{19}$ cm$^{-3}$, and said buried layer of a first conductivity type includes an impurity concentration of $1 \times 10^{16}$ cm$^{-3}$–$1 \times 10^{19}$ cm$^{-3}$.

* * * * *